United States Patent [19]

Cox et al.

[11] 4,045,734

[45] Aug. 30, 1977

[54] DIFFERENTIAL THERMAL WATTMETER

[75] Inventors: Louis G. Cox; Norbert L. Kusters, both of Ottawa, Canada

[73] Assignee: Canadian Patents and Development Limited, Ottawa, Canada

[21] Appl. No.: 689,643

[22] Filed: May 24, 1976

[51] Int. Cl.² ............................................. G01R 21/02
[52] U.S. Cl. .................................... 324/142; 324/106; 324/132
[58] Field of Search ................. 324/142, 98, 106, 132; 235/151.31

[56] References Cited

U.S. PATENT DOCUMENTS

| | | | |
|---|---|---|---|
| 3,486,014 | 12/1969 | Richman | 324/142 X |
| 3,723,845 | 3/1973 | Duckworth | 324/106 X |
| 3,842,349 | 10/1974 | Cox | 324/98 |
| 3,911,359 | 10/1975 | Metcalf | 324/132 X |

*Primary Examiner*—Stanley T. Krawczewicz
*Attorney, Agent, or Firm*—Edward Rymek

[57] ABSTRACT

The differential thermal wattmeter for the ac/dc transfer of power includes a differential thermal converter as a "sum and difference" multiplier, with both ac and dc voltage and current signals simultaneously applied to both heaters. DC feedback to the current input speeds up the response and maintains thermal balance between the heaters, so that the output meter becomes a null indicator. This reduces and can eliminate the need for quadratic response. The requirement for exact matching of the thermal converters is also eliminated by effective interchange of the heaters.

7 Claims, 3 Drawing Figures

DIFFERENTIAL THERMAL WATTMETER

This invention is directed to precision wattmeters and in particular to a thermal wattmeter having thermal converters in a feedback arrangement.

The classical thermo-couple wattmeter is described in the text "Electrical Measurements" by F. K. Harris, fifth printing, April 1962, John Wiley and Sons Ltd., New York, on pages 490 to 494. It includes a symmetrical bridge circuit in which two branches are the heating elements of a matched pair of thermoelements. The thermocouples are connected in opposition and their combined output is a dc voltage V which is equal to Kei, the power being measured. Though this type of instrument is relatively simple and is free from some of the errors inherent in electrodynamic instruments, it has not provided high accuracy since the thermocouples or thermal converters in the instrument do not have quadratic and identical response. In addition, the speed of response of the thermal wattmeter is found to be slow.

It is therefore an object of this invention to provide a thermal wattmeter of high accuracy.

It is a further object of this invention to provide a thermal wattmeter having a rapid rate of response.

These and other objects are achieved in a thermal wattmeter for measuring the active power corresponding to ac voltage and current components from representative ac signals u and i which includes two thermal converters each having a heater and at least one sensor such as a thermocouple. The respective sensors of the two converters are interconnected so as to provide a dc difference signal. An amplifier is coupled to the sensor output and produces a feedback dc signal $I_m$. An adjustable dc reference source provides a dc signal which is added to the signal $I_m$ to provide a dc signal $I = I_m + I_{dc}$, and a fixed dc reference source provides a dc signal $U_{dc}$. The wattmeter further includes first means for applying the sum of the ac signals u and i and the difference of the dc signals $U_{dc}$ and $I$ to one of the heaters and a second means for applying the difference of the ac signals u and i, and the sum of the dc signals $U_{dc}$ and $I_T$ to the other heater such that when $P_{ac} = U_{dc}I$, where $$P_{ac} = \frac{1}{T} \int_O^T uidt,$$

the active power is a function of $I$. When $I_{dc} = 0$, a meter coupled to the feedback amplifier provides a reading of the power which then is a function of $I_m$. When $I_{dc}$ is adjusted to obtain a null on the meter, i.e. $I_m = 0$, then the power is a function of $I_{dc}$.

The signals $u$, $i$, $I$ and $U_{dc}$ may be applied to the heaters by resistor-amplifier circuits and inverter circuits so as to obtain the proper polarities and phase.

Figure 1:
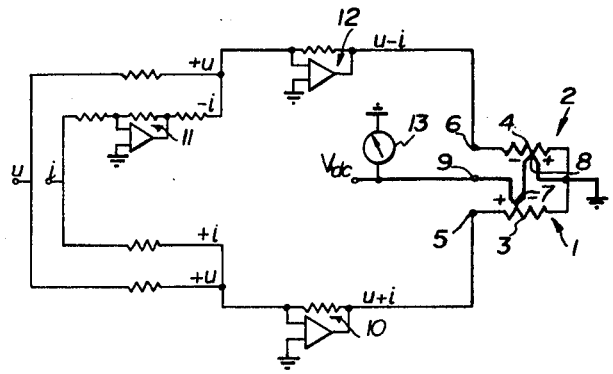
FIG. 1 illustrates a classical thermal wattmeter.

FIG. 1 is a schematic of a modern version of the classical thermal wattmeter for measuring the power corresponding to an ac voltage and an ac current, using two thermal converters 1 and 2 in the "sum and difference" or the "quarter-square" multiplier mode. The ac signals u and i are proportional to and represent the ac voltage and current respectively. Each thermal converter 1 and 2 includes a heater element 3 and 4 respectively having an input terminal 5 and 6 respectively and at least one thermocouple junction 7 and 8 respectively. As shown, the junctions 7 and 8 are coupled in series opposition such that the combined output signal from the thermal converters at terminal 7 is the difference between the thermocouple junction 7 and 8 signals.

To obtain a measure of the power, the sum of the signals u and i are applied to one of the heater elements. In FIG. 1, the signals u and i are added by an amplifier 10 and then applied to heater element 3 via input terminal 5. The resultant signal across junction 7 is proportional to $(u+i)^2$. In addition, the difference of the signal u and i is applied to the other heater element 4. As illustrated i is applied to an inverter 11, the signals u and $-i$ are added by an operational amplifier 12 and then applied to heater element 4 via input terminal 6. The resultant signal across junction 8 is proportional to $(u-i)^2$.

Since the thermocouple junctions 7 and 8 are connected in series opposition the dc output signal $V_{dc}$ at terminal 9 is the difference of the signals at the respective thermocouple junctions:

$$V_{dc} = k\frac{1}{T} \int_o^T [(u + i)^2 - (u - i)^2] dt \tag{1}$$

$$V_{dc} = k\frac{1}{T} \int_o^T [u^2 + 2ui + i^2 - u^2 + 2ui - i^2] dt$$

$$V_{dc} = k\frac{1}{T} \int_o^T [4ui] dt$$

where T is the period of the ac signals.

Thus, if the thermal converter 1 and 2 have quadratic and identical responses, $V_{dc}$ which is measured by a meter 13, is proportional to the active power $ui$. In practice the responses will not be quadratic and will not be identical, leading to inaccuracies, and the speed of response of the thermal wattmeter will be slow. However, the wattmeter may be calibrated by direct substitution of dc instead of ac signals, with polarity reversal of the dc signals to average out dc reversal error.

In order to calibrate the thermal wattmeter at unity power factor by ac/dc substitution, both a primary balance $P_{ac} = U_{dc}I_{dc}$, and a secondary balance $U_{ac} = U_{dc}$ or $I_{ac} = I_{dc}$, are necessary if the thermal converters are not perfectly quadratic, where:

$$P_{ac} = \frac{1}{T} \int_O^T (ui) dt \tag{2}$$

$$U_{ac}^2 = \frac{1}{T} \int_O^T i^2 dt \tag{3}$$

and $$I_{ac}^2 = \frac{1}{T} \int_O^T i^2 dt \tag{4}$$

At lower power factors, converter mismatch would introduce additional errors.

Figure 2:
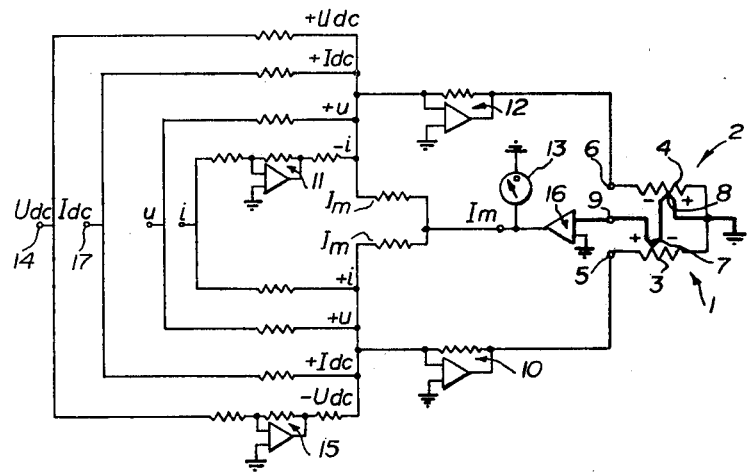
FIG. 2 is a schematic to illustrate the principles of the thermal wattmeter with feedback in accordance with this invention.

FIG. 2 schematically illustrates the thermal wattmeter in accordance with the present invention in simplified form. The elements in FIG. 2 which are identical to the elements in FIG. 1 are designated by the same reference numbers.

Basically, in this improved wattmeter, the sm of the ac signals $u$ and $i$ is again applied to one heater 3 whle the difference is applied to the other heater 4. However, in addition two dc signals $U_{cd}$ and I, represnting a dc voltage and current respectively, are applied to heaters 3 and 4, but in this instant, the difference of the dc signals $(-U_{dc} + I)$ is applied to one heater 3 while the sum of the dc signals $(U_{dc} + I)$ is applied to the other heater 4. Thus a combined signal $(u + i - U_{dc} + I)$ is applied to terminal 5 of heater 3 and a combined signals $(u - i + U_{dc} + I)$ is applied to terminal 6 of heater 4. The resultant signal across junction 8 will be proportional to $(u + i - U_{dc} + I)^2$ and the resultant signal across junction 9 will be proportional to $(u-i+U_{dc}+I)^2$.

Since the junctions 8 and 9 are in series opposition, the dc output signal $V_{dc}$ at terminal 9 will be $$V_{dc} = k \frac{1}{T} \int_0^T [(u + i - U_{dc} + I)^2 - (u - i + U_{dc} + I)^2] \, dt \quad (5)$$

$$V_{dc} = k \frac{1}{T} \int_0^T [(u^2 + 2ui - 2U_{dc}u + 2Iu + i^2 - 2U_{dc}i + 2Ii + U_{dc}^2 - 2U_{dc}I + I^2) - (u^2 - 2 + 2U_{dc}u + 2Iu + i^2 - 2U_{dc}i - 2Ii + U_{dc}^2 + 2U_{dc}I + I^2)] \, dt$$

$$V_{dc} = k \frac{1}{T} \int_0^T [4ui - 4U_{dc}I - 4uU_{dc} + 4iI] \, dt$$

When equation 5 is integrated over a period $T$, the terms $(-4uU_{dc})$ and $(4iI)$ are equal to 0 and since $(-4U_{dc}I)$ is a dc term $$V_{dc} = k \frac{1}{T} \int_0^T (4ui) \, dt - 4U_{dc}I \quad (6)$$

From equation 6, it can be seen that if $U_{dc}I$ is adjusted such that $V_{dc} = 0$, then $P_{ac} = U_{dc}I$.

As illustrated in FIG. 2, the signals $U_{dc}$ which is produced by a constant known source (not shown) is applied to terminal 14 and thus directly to summing amplifier 12 and through an inverter 15 to summing amplifier 10. The signal I may be generated by a feedback amplifier 16 controlled by the signal at output terminal 9. In this case $I = I_m$ and is applied to the input of amplifiers 10 and 12. $I_m$ can be read on meter 13. For greater sensitivity, however, a signal $I_{dc}$ may be generated by an adjustable known dc source, with the $I_{dc}$ signal applied to terminal 17. Thus $P_{ac} = U_{dc}I_{dc} + U_{dc}I_m$ and when $I_{dc}$ is adjusted to obtain a null on meter 13, $P_{ac} = U_{dc}I_{dc}$.

It is further noted from equation 6 above, that the signs of all of the dc signals may be reversed, without affecting the outcome, however it is essential that the difference of the dc signals $U_{dc}$ and I be applied to the same thermal converter as the sum of the ac signals u and i, and that the sum of the dc signals be applied to the same thermal converter as the difference of the ac signals u and i.

A wattmeter in accordance with the above principles has a rapid response time since the thermal time constant is reduced by the feedback loop and does not require calibration at unity power factor by substitution.

Figure 3:
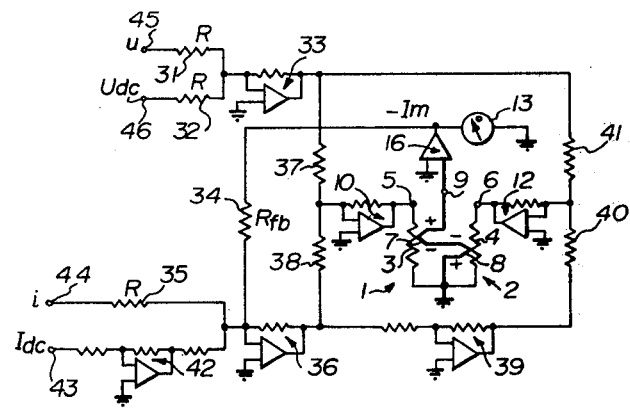
FIG. 3 illustrates the preferred embodiment of a thermal wattmeter with feedback in accordance with this invention.

FIG. 3 illustrates a preferred embodiment of the differential thermal wattmeter in accordance with the present invention. The wattmeter includes a first and a second thermal converter 1 and 2, each having a heater element 3 and 4 respectively and at least one thermocouple junction 7 and 8 respectively connected in series opposition such that the difference of the signals across junctions 7 and 8 will appear on output terminal 9. The thermal converters 1 and 2 may be individual units, however a differential multijunction thermal converter (MJIC) of NPL design is preferred since it operates with a heater temperature rise of only 10° - 15° C and deviation from quadratic response is quite small. This relaxes the necessity for a secondary balance $U_{ac} = U_{dc}$. Other types of thermal converters may be used such as converters having semiconductor temperature sensors however these cannot be directly connected in series opposition, but require conversion circuitry.

The output from the junctions 7 and 8 on terminal 9 is fed to a feedback amplifier 16 which produces the feedback signal $-I_m$. The feedback amplifier 25 may be a two channel feedback amplifier system of the type described in column 2, lines 8 to 24 with respect to FIG. 1 of U.S. Pat. No. 3,842,349 issued on Oct. 15, 1974 to L. G. Cox et al assignors to Canadian Patents and Development Limited. However, in the present wattmeter, the amplifier output is not connected directly to one of the heater elements of the converter, as will be described further below.

The sum and differences of the ac signals u and i and the dc signals $U_{dc}$ and I which may be $I_m$ or $(I_{dc} + I_m)$, are appropriately applied to the thermal converter heaters in the following manner. The fixed dc reference signal $U_{dc}$ is superimposed upon the ac signals $u$ by means of resistors 31 and 32 respectively and an operational amplifier 33. Similarly, the feedback signal $-I_m$ is superimposed upon the ac signal i by means of resistors 34 and 35 respectively and an operational amplifier 36. These signals are summed through resistors 37 and 39 respectively and operational amplifier 10 whose input is applied to terminal 5 of heater 3. Thus the signal $(u + i + U_{dc} - I)$, the sum of the ac signals and the difference of the dc signals, is applied to the first heater 3. For the second heater 4, the output signal from amplifier 36 is inverted by inverter 39 and then summed with the output from amplifier 33 through resistors 40, 41 and operational amplifier 12 whose output is applied to terminal 6 of heater 4. Thus the signal $(u-i + U_{dc} + I)$, the difference of the ac signals and the sum of the dc signals is applied to heater 4. With the feedback amplifier 16 set to achieve power balance $P_{ac} = U_{dc}I$ and $I = I_m$, the ac power is directly read from the appropriately calibrated meter 13. If a further adjustable dc signal $-I_{dc}$ is applied to the input of amplifier 36 and adjusted such that the $I_m = O$, then the ac power is directly read by the adjustment made on $I_{dc}$. The meter 13 is therefore primarily a null indicator, whose deviation is proportional to the difference between the ac and dc power levels. The meter sensitivity is proportional to the ratio $R_{fb}/R$, and the high sensitivity required in a null instrument is easily obtainable.

For the above wattmeter, the ac signals u and i may be derived from a voltage divider and two-stage current transformer. The dc signals $I_{dc}$ and $U_{dc}$ may be derived from a precision supply and a Kelvin Varley divider. Various panel controls may be used for ac/dc channel interchange, dc polarity reversal, and meter sensitivity selection.

To determine errors in the wattmeter, a number of input interchanges may be performed. By using an inverter circuit 42 to derive the $-I_{dc}$ signal from an $I_{dc}$ signal, the thermal heaters 3 and 4 are effectively interchanged when signal $i$ is interchanged with signal $I_{dc}$ by applying signal $i$ to terminal 43 and signal $I_{dc}$ to terminal 44. This interchange averages out the response of the thermal converters. Similarly errors caused by thermal converter mismatch and channel gain mismatch are determined by averaging two readings with total ac/dc channel interchange, i.e. by applying signals $i$ and $I_{dc}$ to terminals 43 and 44 respectively as above and signals $u$ and $U_{dc}$ to terminals 45 and 46 respectively.

At low power factors a difference of amplifier phase response could cause error. This can be determined by interchanging the $u$ and $i$ signals, i.e. by applying the $u$ signal to terminal 44 and the $i$ signal to terminal 45.

Finally errors caused by amplifier offset voltages and by dc reversal effects in the thermal converters 1 and 2 are eliminated by averaging two readings with the polarity of the dc signals $U_{dc}$ and $I_{dc}$ reversed, and with the polarity of $-I_m$ simultaneously reversed to maintain feedback loop stability.

From the above, it can be seen that the present wattmeter may be calibrated periodically by simply interchanging the input signals.

The superposition of ac and dc signals on the thermal converter, interchange of heaters by current signal reversals, and speed-up response by feedback to the current input makes possible the construction of a fast-acting accurate differential thermal wattmeter for use with sinusoidal or non-sinusoidal voltage and current waveforms. The converter heaters are fully protected against burnout, and crest factors of 4:1 in the current or voltage signals are permissible without degradation of accuracy. The maximum meter sensitivity is ± 100 ppm of full power, with a resolution of better than 20 ppm.

We claim:

1. A thermal wattmeter for determining active power corresponding to ac voltage and current components from proportionally representative ac signals u and i comprising:
    two thermal converter means, each of said converter means having heater and sensor means for converting an input signal to a dc output signal;
    means for connecting the outputs of the first and second converter means in opposition to provide a dc difference signal;
    amplifier means coupled to said connecting means for generating a dc feedback signal $I_m$;
    first source means for providing a predetermined adjustable dc reference signal $I_{dc}$;
    means for adding dc feedback signal $I_m$ and the adjustable signal $I_{dc}$ to produce a dc output signal I;
    second source means for providing a predetermined dc reference signal $U_{dc}$;
    first means for coupling the sum of the ac signals u and i and the difference of the dc signals $U_{dc}$ and I to one of the heater means; and
    second means for coupling the difference of the ac signals u and i and the sum of the dc signals $U_{dc}$ and I to the second heater means whereby the active power $P_{ac}$ of the ac components is determined as a function of $U_{dc}I$.

2. A thermal wattmeter as claimed in claim 1 which further includes null detector meter means for monitoring $I_m$ such that $P_{ac}$ is determined as a function of $U_{dc}I_{dc}$ when $I_m = 0$.

3. A theremal wattmeter as claimed in claim 1 wherein said first and second thermal converter means consists of a differential multi-junction thermal converter.

4. A thermal wattmeter for determining active power corresponding to ac voltage and current components from proportionally representative ac signals u and i comprising:
    first and second thermal converter means, eah of said conerter means having a heater and at least one thermocouple junction for converting an input signal to a dc output signal, the thermocouple junction of the first converter means being connected in series opposition to the thermocouple junction of the second converter means to provide a difference dc output;
    amplifier means coupled to said converter means to amplify the difference dc output to provide a dc signal $-I_m$;
    first source means for providing predetermined adjustable dc reference signal $-I_{dc}$;
    second source means for providing a predetermined dc reference signal $U_{dc}$;
    first summing means for adding the u signal and the $U_{dc}$ signal;
    second summing means for adding the i signal, the $-I_{dc}$ signal and the $-I_m$ signal; and
    means coupled to the first and second summing means to apply the sum of the first and second added signals to one of the heater means and to apply the difference of the first and second added signals to the other of the heater means whereby the active power $P_{ac}$ of the ac components is determined as a function of $U_{dc}(I_m+I_{dc})$.

5. A wattmeter as claimed in claim 4 wherein the adjustable dc reference source includes means for inverting a dc signal $I_{dc}$ to provide the adjustable dc signal $-I_{dc}$.

6. A wattmeter as claimed in claim 5 which further includes null detector means for monitoring $I_m$ such that $P_{ac}$ is determined as a function of $U_{dc}I_{dc}$ when $I_m = 0$.

7. A wattmeter as claimed in claim 6 wherein said first and second thermal converter means consists of a differential multi-junction thermal converter.

* * * * *